(12) United States Patent
Hung et al.

(10) Patent No.: US 11,901,188 B2
(45) Date of Patent: *Feb. 13, 2024

(54) METHOD FOR IMPROVED CRITICAL DIMENSION UNIFORMITY IN A SEMICONDUCTOR DEVICE FABRICATION PROCESS

(71) Applicant: Taiwan Semiconductor Manufacturing Company, Ltd., Hsin-Chu (TW)

(72) Inventors: Chi-Cheng Hung, Toufen Township (TW); Chun-Kuang Chen, Guanxi Township (TW); De-Fang Chen, Hsinchu (TW); Wei-Liang Lin, Hsin-Chu (TW); Yu-Tien Shen, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/705,615

(22) Filed: Mar. 28, 2022

(65) Prior Publication Data
US 2022/0223428 A1    Jul. 14, 2022

Related U.S. Application Data

(63) Continuation of application No. 16/925,122, filed on Jul. 9, 2020, now Pat. No. 11,289,338, which is a
(Continued)

(51) Int. Cl.
*H01L 21/308* (2006.01)
*H01L 21/027* (2006.01)
(Continued)

(52) U.S. Cl.
CPC ........ *H01L 21/3086* (2013.01); *H01L 21/027* (2013.01); *H01L 21/0274* (2013.01);
(Continued)

(58) Field of Classification Search
None
See application file for complete search history.

(56) References Cited

U.S. PATENT DOCUMENTS 8,039,179 B2   10/2011  Shieh et al.
8,202,681 B2    6/2012  Lin et al.
(Continued)

*Primary Examiner* — Stephanie P Duclair
(74) *Attorney, Agent, or Firm* — HAYNES AND BOONE, LLP

(57) ABSTRACT

Exemplary methods of patterning a device layer are described, including operations of patterning a protector layer and forming a first opening in a first patterning layer to expose a first portion of the protector layer and a first portion of the hard mask layer, which are then are exposed to a first etch to form a first opening in the first portion of the hard mask layer. A second opening is formed in a second patterning layer to expose a second portion of the protector layer and a second portion of the hard mask layer. The second portion of the protector layer and the second portion of the hard mask layer are exposed to an etch to form a second opening in the second portion of the hard mask layer. Exposed portions of the device layer are then etched through the first opening and the second opening.

20 Claims, 13 Drawing Sheets

Related U.S. Application Data continuation of application No. 16/042,240, filed on Jul. 23, 2018, now Pat. No. 10,714,357, which is a continuation of application No. 15/169,249, filed on May 31, 2016, now Pat. No. 10,032,639.

(51) Int. Cl.

| | | |
|---|---|---|
| *H01L 21/31* | (2006.01) | |
| *H01L 21/311* | (2006.01) | |
| *H01L 21/033* | (2006.01) | |
| *H01L 21/306* | (2006.01) | |
| *H01L 21/3065* | (2006.01) | |
| *G03F 7/00* | (2006.01) | |

(52) U.S. Cl.
CPC ...... *H01L 21/0332* (2013.01); *H01L 21/0337* (2013.01); *H01L 21/308* (2013.01); *H01L 21/3065* (2013.01); *H01L 21/3081* (2013.01); *H01L 21/3085* (2013.01); *H01L 21/3088* (2013.01); *H01L 21/30604* (2013.01); *H01L 21/31* (2013.01); *H01L 21/31144* (2013.01); *G03F 7/0035* (2013.01)

(56) References Cited

U.S. PATENT DOCUMENTS

| | | | |
|---|---|---|---|
| 8,728,332 | B2 | 5/2014 | Lin et al. |
| 8,822,243 | B2 | 9/2014 | Yan et al. |
| 2006/0091468 | A1 | 5/2006 | Liaw |
| 2009/0142932 | A1 | 6/2009 | Jung |
| 2011/0281208 | A1 | 11/2011 | Lin et al. |
| 2012/0278776 | A1 | 11/2012 | Lei et al. |
| 2013/0260559 | A1 | 10/2013 | Park et al. |
| 2013/0295769 | A1 | 11/2013 | Lin et al. |
| 2013/0320451 | A1 | 12/2013 | Liu et al. |
| 2014/0193974 | A1 | 7/2014 | Lee et al. |
| 2014/0215421 | A1 | 7/2014 | Chen et al. |
| 2014/0242794 | A1 | 8/2014 | Lin et al. |
| 2014/0264760 | A1 | 9/2014 | Chang et al. |
| 2014/0264899 | A1 | 9/2014 | Chang et al. |
| 2014/0273442 | A1 | 9/2014 | Liu et al. |
| 2014/0273446 | A1 | 9/2014 | Huang et al. |
| 2017/0345670 | A1 | 11/2017 | Hung et al. |
| 2018/0330960 | A1 | 11/2018 | Hung et al. |
| 2020/0343097 | A1 | 10/2020 | Hung et al. |

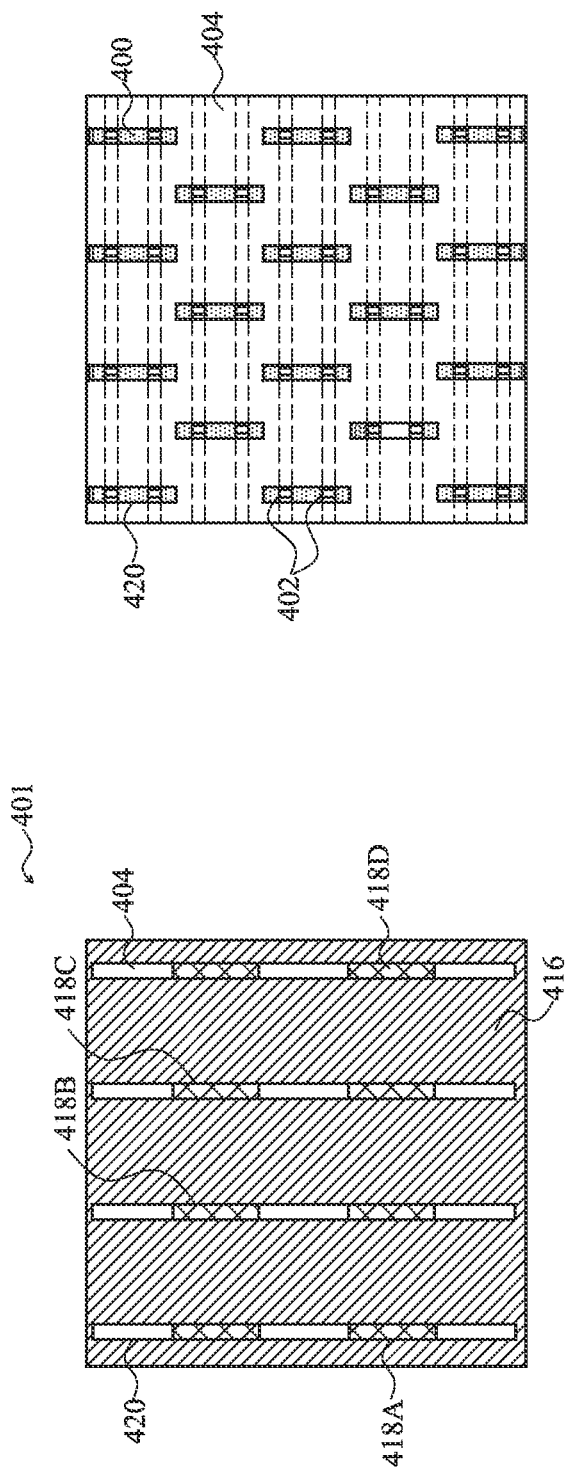
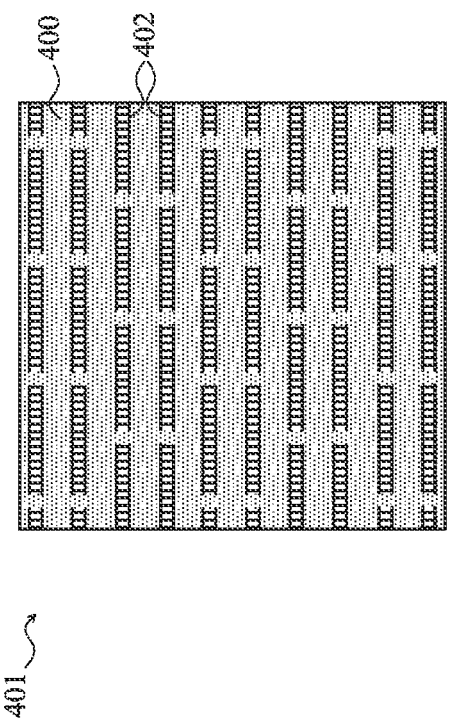
FIG. 4F
FIG. 4G
FIG. 4E

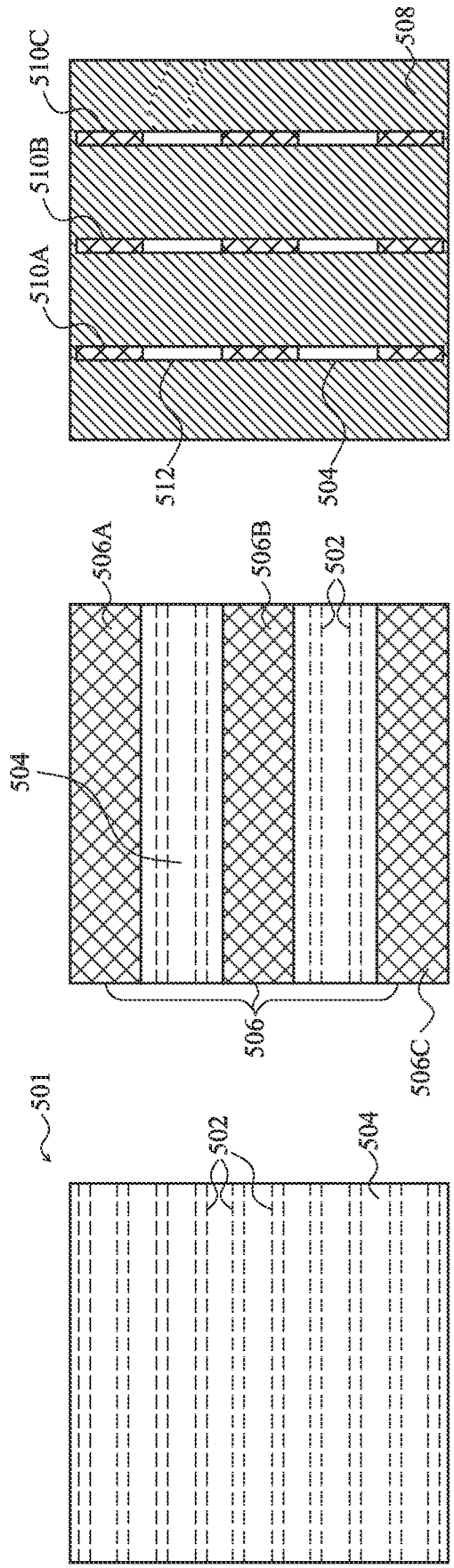

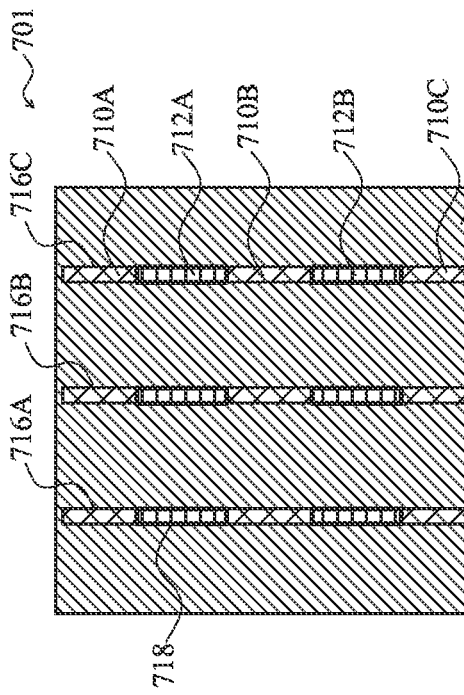
FIG. 7B
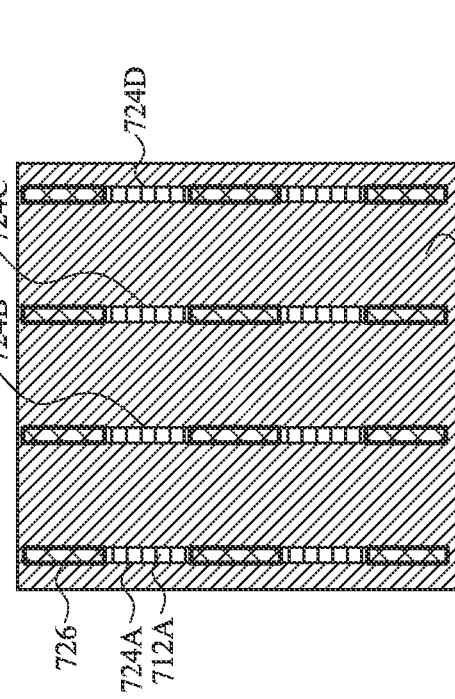
FIG. 7D
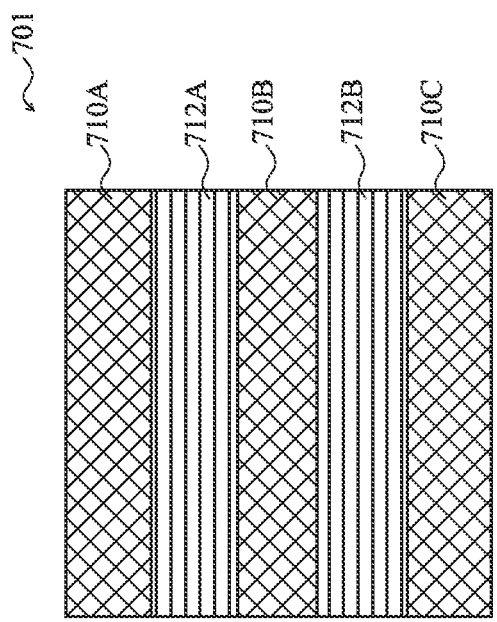
FIG. 7A
FIG. 7C

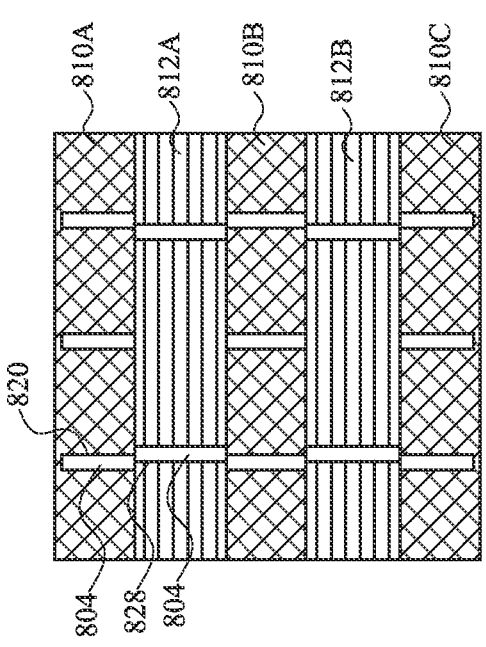
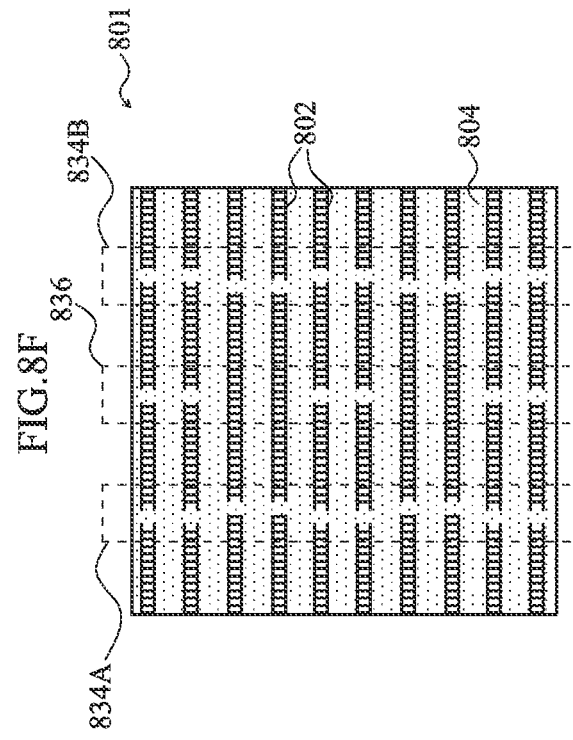
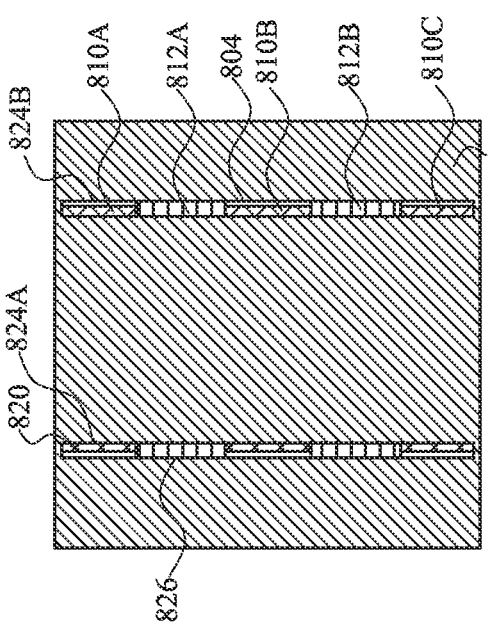
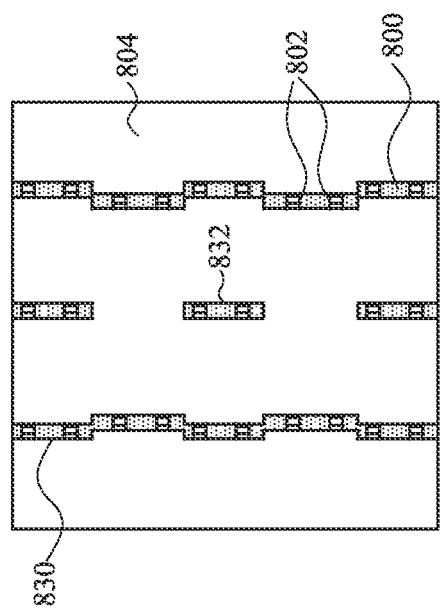

METHOD FOR IMPROVED CRITICAL DIMENSION UNIFORMITY IN A SEMICONDUCTOR DEVICE FABRICATION PROCESS

PRIORITY DATA

The present application is a continuation application of U.S. application Ser. No. 16/925,122, filed Jul. 9, 2020, which is a continuation application of U.S. application Ser. No. 16/042,240, filed Jul. 23, 2018, now U.S. Pat. No. 10,714,357, which is a continuation application of U.S. application Ser. No. 15/169,249, filed May 31, 2016, now U.S. Pat. No. 10,032,639, each of which is hereby incorporated by reference in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

A semiconductor wafer is processed by a semiconductor manufacturer to form various integrated circuits (IC) in different regions of the wafer. The wafer includes a substrate with many patterned material layers thereon that form the discrete devices that make up a circuit. Variations in pattern density over the different regions can cause various issues including critical dimension (CD) variation or CD uniformity. As the node or scale of the semiconductor fabrication decreases to advanced technologies, such as from 45 nm to 32 nm and to 28 nm, the functionalities of an IC device are more sensitive to the CD variations and uniformity. For example, dense lines and isolated lines are common in IC layout and cannot be avoided by the design rules. However, as the feature size decreases, high fidelity replication of such mask features into an underlying material layer can be problematic. Additionally, as the technologies have advanced, some currently use approaches may have limited effectiveness and applicability. Therefore, there is a need of methods to address such issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features, whether on the devices or the wafers and semiconductor features described herein, may be arbitrarily increased or reduced for clarity of discussion.

FIGS. 4A, 4B, 4C, 4D, 4E, 4F, and 4G are top view illustrations of a portion of a semiconductor wafer undergoing processing according to an embodiment of the method of FIG. 3, according to aspects of the present disclosure.

FIGS. 5A, 5B, 5C, 5D, 5E, 5F, 5G, 5H, and 5I are top view illustrations of a portion of a semiconductor wafer undergoing processing according to another embodiment of the method of FIG. 3, according to aspects of the present disclosure.

FIGS. 7A, 7B, 7C, 7D, 7E, 7F, 7G, and 7H are top view illustrations of a portion of a semiconductor wafer undergoing processing according to an embodiment of the method of FIG. 6, according to aspects of the present disclosure.

FIGS. 8A, 8B, 8C, 8D, 8E, 8F, 8G, and 8H are top view illustrations of a portion of a semiconductor wafer undergoing processing according to another embodiment of the method of FIG. 6, according to aspects of the present disclosure.

Figure 1:
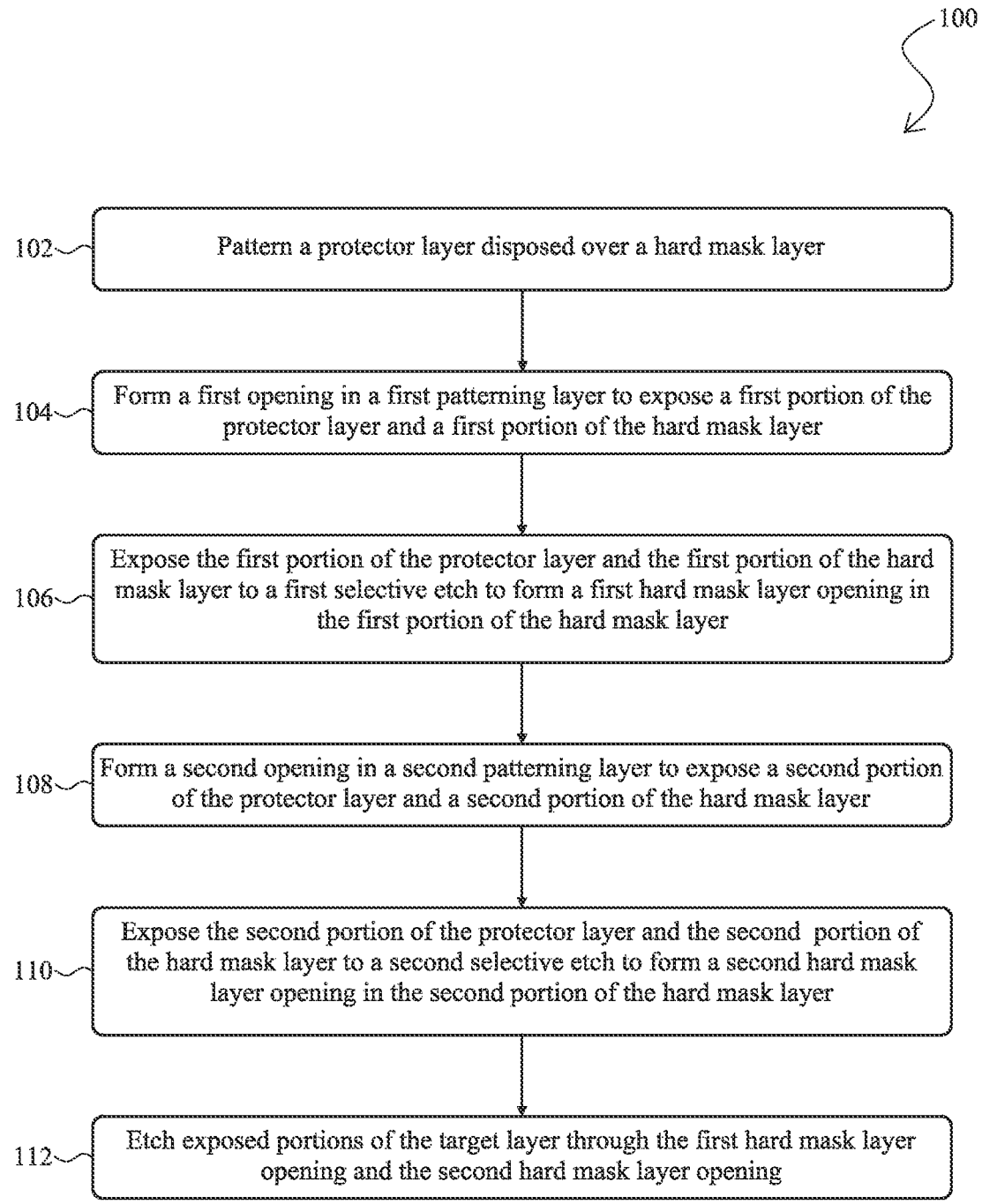
FIG. 1 is a flowchart of a method of patterning a device layer, according to aspects of the present disclosure.

These figures will be better understood by reference to the following detailed description.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing operations and/or features of a device may be only briefly described, some such operations and/or features being known to those of ordinary skill in the art. Also, additional processing steps or features can be added and certain of the following processing steps or features can be removed and/or changed while still implementing the claims. Thus, the following description should be understood to represent examples only, and are not intended to suggest that one or more steps or features is required in every embodiment.

Referring now to FIG. 1, illustrated therein is a flowchart of a method 100 of patterning a device layer during a semiconductor device fabrication process. As illustrated, the method 100 includes several enumerated steps or operations. Embodiments of the method 100 may include additional steps or operations before, after, in between, or as part of the enumerated steps or operations shown in FIG. 1. Some embodiments of the method 100 may omit one or more of the enumerated operations. The method 100 may be performed in a semiconductor device fab, which may include many different fabrication tools including dry and immersion photolithography tools, etching chambers or etchant tanks to perform dry and or wet etching processes, cleaning tools, deposition tools, etc.

An embodiment of the method 100, as illustrated in FIG. 1, may begin at operation 102 in which a protector layer, disposed over a hard mask layer, is patterned. The protector layer may be patterned by a photolithographic process in which a photoreactive material layer is formed over the protector layer. The photoreactive material layer is exposed to radiation energy, such as extreme ultraviolet light, and then developed to reveal a pattern corresponding to the exposure. An etching process may remove exposed portions of the protector layer defined by the pattern in the photoreactive material layer.

At operation 104, a first opening in a first patterning layer may be formed to expose a first portion of the protector layer and the first portion of the hard mask layer underneath the protector layer. At operation 106, the first portion of the protector layer and the first portion of the hard mask layer may be exposed to a first selective etch process to form a first hard mask layer opening in the first portion of the hard mask layer. The etch process may be selective in that etching of the hard mask layer occurs at a significantly higher rate, such as an order of magnitude higher, than any etching of the protector layer which may occur.

At operation 108, a second opening may be formed in a second patterning layer to expose a second portion of the protector layer and the second portion of the hard mask layer. This operation may be performed by a photolithographic process as described with respect to operation 104. At operation 110, the second portion of the protector layer and the second portion of the hard mask layer may be exposed to a second selective etch to form a second hard mask layer opening in the second portion of the hard mask layer. After the formation of the first and second hard mask layer openings, an etch process may be performed to exposed portions of the device layer through the first and second hard mask layer openings, at operation 112.

Figure 2B:
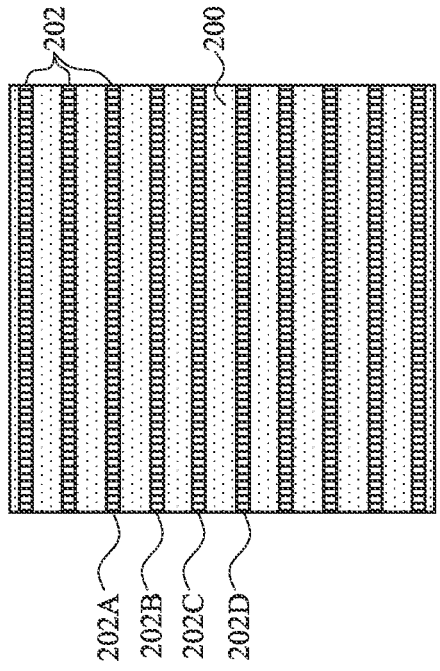
FIGS. 2A, 2B, 2C, 2D, 2E, 2F, 2G, and 2H are top view illustrations of a portion of a semiconductor wafer undergoing processing according to an embodiment of the method of FIG. 1, according to aspects of the present disclosure.
Figure 2D:
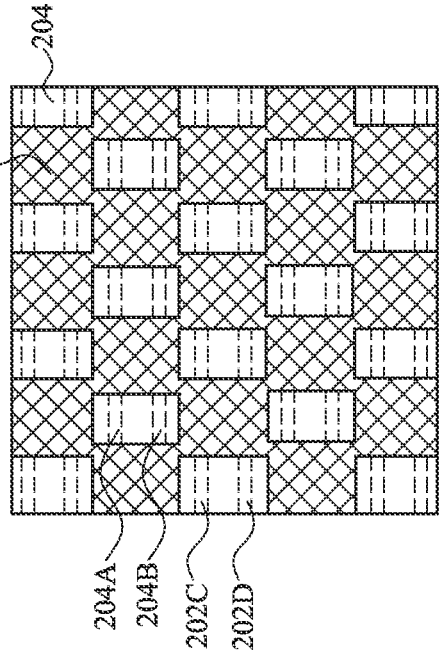
Figure 2A:
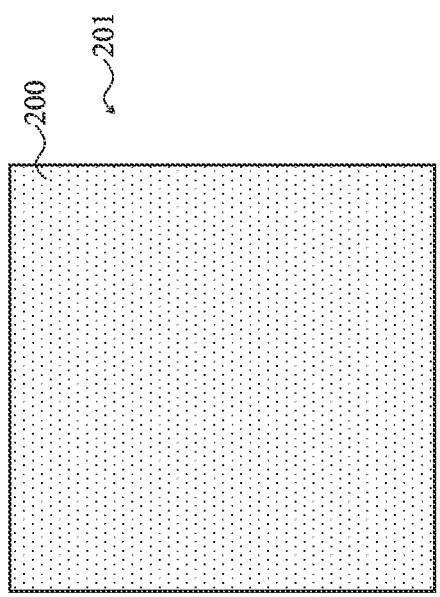

For clarity of explanation, the method 100 is further described herein with respect to the top view illustrations of a semiconductor wafer 201 in FIGS. 2A, 2B, 2C, 2D, 2E, 2F, 2G, and 2H. FIG. 2A is a top view of a portion of a substrate 200 of the wafer 201. The wafers and substrates described herein may take various forms including but not limited to wafers (or portions thereof) or substrates of individual devices such as chips (e.g., fabricated on a wafer). Various features may be formed on the substrate 200 by the addition, subtraction, and alteration of material layers formed on the substrate to produce integrated circuits including those formed by CMOS-based processes, MEMS devices, image sensors, and the like. While the wafer 201 and substrate 200 may be circular when viewed from above in its entirety, only a portion of the wafer 201 and substrate 200 is shown in FIG. 2A. In some embodiments, the substrate 200 may include one or more layers thereon such that the illustrated layer labeled "200" in FIG. 2A is a material layer disposed over the substrate of wafer 201.

Referring now to FIG. 2B, shown therein is a patterned device layer 202. As illustrated, the patterned device layer 202 includes a series of parallel lines including parallel lines 202A, 202B, 202C, 202D and others which are collectively referred to as the device layer 202. In some embodiments, the parallel lines of the patterned device layer may be separate from each other by less than 10 nm. For example, the substrate 200 may be a silicon oxide layer and the patterned device layer may include parallel lines formed from polysilicon. The substrate 200 and the device layer 202 may be formed from other materials in other embodiments of the present disclosure. In some embodiments, the device layer may be a masking layer that needs to be patterned further by another patterning process due to process constraints or may have features sufficiently small (for example, features 16 nm or less) that adequate critical dimension uniformity is difficult to obtain. For example, the lines 202A-D of the device layer 202 may need to be cut.

Figure 2C:
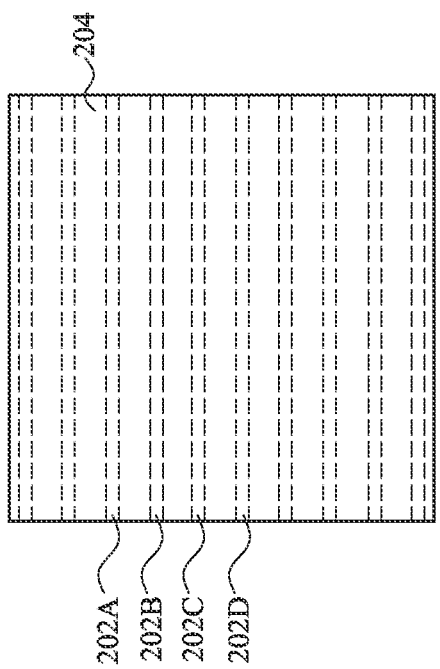

Referring now to FIG. 2C, shown therein is an intermediate, sacrificial layer referred to as hard mask layer 204. The hard mask layer 204 may be a silicon nitride layer, a silicon oxide layer, a metal layer, a metal oxide layer, a metal nitride layer or other material layer that covers the exposed portions of the substrate 200 and the device layer 202 shown in FIG. 2B. The lines 202A-D and other patterned lines of the device layer 202 are illustrated with the dashed lines shown in FIG. 2C to show their approximate location on the wafer 201.

Referring now to FIG. 2D, shown therein is a patterned protector layer 206, as may be formed in operation 102. The protector layer 206 may be formed from silicon nitride, in some embodiments, and formed from other materials in other embodiments. As shown, the protector layer 206 is patterned with a "checkerboard" pattern such that repeating arrays of openings in the protector layer 206 are arranged in offset rows, resembling a checkerboard or chessboard. As illustrated, the openings in the protector layer 206 are generally rectangular in shape having a minor axis and a major axis, while the remaining portions of the protector layer 206 are substantially square, i.e. having two equal axes. Other embodiments of the protector layer 206 may have different geometries for the openings such that the remaining portions have different geometries as well. The openings in the protector layer 206 may expose the hard mask layer 204 which may be positioned directly under the protector layer 206 such that the protector layer 206 directly contacts the hard mask layer 204.

Figure 2E:
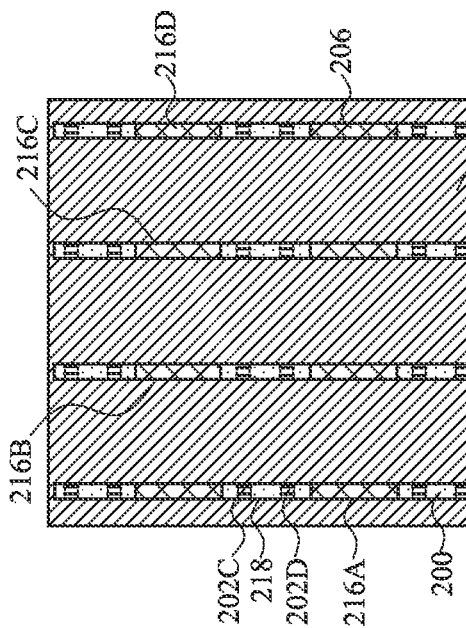

Referring now to FIG. 2E, shown therein is a first patterning layer 208 with a plurality of windows or openings 210A, 210B, and 210C, collectively referred to as openings 210. At operation 104 of the method 100, the first patterning layer 208 may be formed as a layer of photoreactive material, such as photoresist. The photoresist may be a positive or negative photoresist. The photoresist may be selectively exposed to radiation, such as by an ArF laser source or other radiation source, including extreme ultraviolet radiation sources, such that only the portions defined by photomask features corresponding to openings 210A, 210B, and 210C are exposed (if a positive photoresist) or are covered (if a negative photoresist). In some embodiments, the first patterning layer 208 may be another material layer, such as silicon oxide, silicon nitride, or another patterning layer that is first patterned using a layer of photoresist and then is used to pattern underlying layers, like hard mask layer 204.

The openings 210 and the protector layer 206 combine to define windows or openings, like the exemplary opening 212. As illustrated in FIG. 2E, multiple openings like the exemplary opening 212 are formed by the overlapping geometries of the protector layer 206 and the openings 210. When a selective etch is performed, at operation 106, that etches exposed portions of the hard mask layer 204 without significantly etching the portions of the protector layer 206 exposed by the openings 210, or the device layer 202 beneath the hard mask layer 204. For example, the etch process may remove the hard mask layer 204 at an etch rate that is an order of magnitude, or more, faster than the etch rate of the protector layer 206. The etch process may be a wet etch or dry etch. The formation of the exemplary opening 212 may be a first patterning to the hard mask layer 206.

Figure 2F:
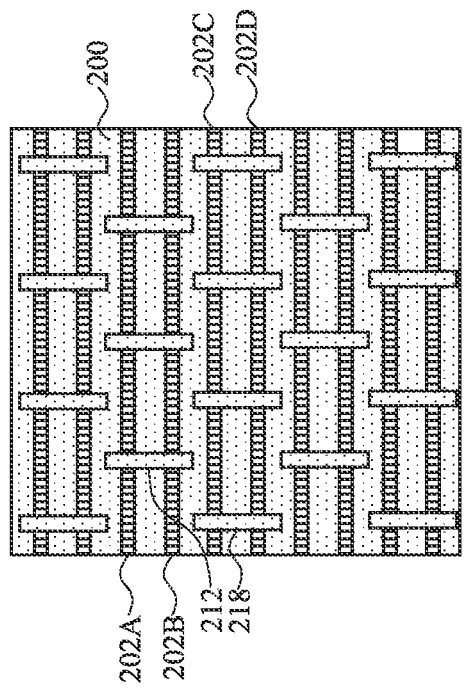

Referring now to FIG. 2F, shown therein is a second patterning layer 214. The second patterning layer 214 may be a photoreactive layer formed, at operation 108, over the substrate 200, the device layer 202, the hard mask layer 204, the protector layer 206, and any other intervening layer. Before the second patterning layer 214 is formed, the first patterning layer 208 may be removed by a stripping process or etching process. The second patterning layer 214 may be patterned to form windows or openings 216, including individual openings 216A, 216B, 216C, and 216D. The overlapping geometries of the openings 216 and the protector layer 206 combine to form areas that define windows or openings, like the exemplary opening 218. Exposing the wafer to another selective etch process may remove exposed portions of the hard mask layer 204, at operation 110. The exemplary opening 218 and other similar openings as described are transferred into the hard mask layer 204 by the selective etch process. As shown, the selective etch process has been performed such that the opening 218 shows parallel lines 202C and 202D of the device layer 202 and a portion of the substrate 200.

Figure 2G:
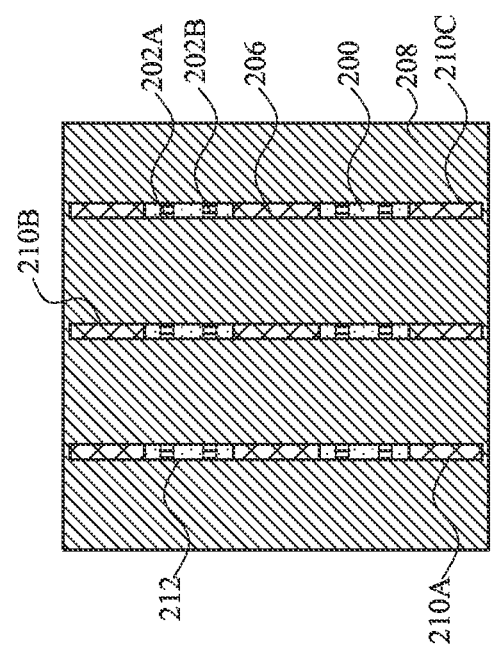
Figure 2H:
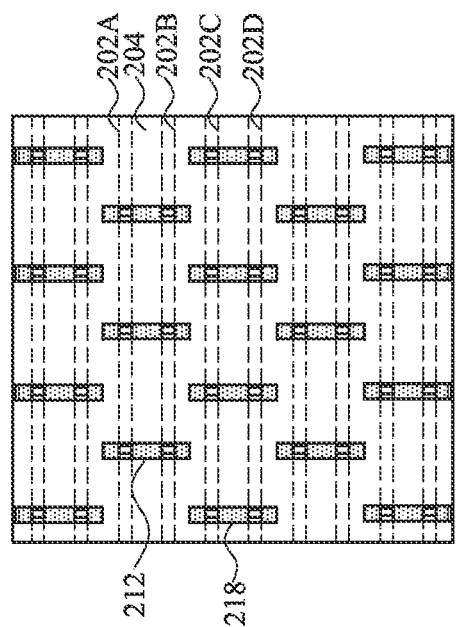

FIG. 2G illustrates the wafer 201 after removal of the second patterning layer 214 and the protector layer 206. Accordingly, the hard mask layer 204 is shown along with the opening 218 and the opening 212, and other associate openings, formed therein to expose portions of the device layer 202, including the parallel lines 202A-D and the others shown in FIG. 2G. Portions of the parallel lines 202A-D that are covered by the hard mask layer 204 are shown by the dashed lines. Exposed portions of the parallel lines 202A-D can be seen in the openings 212, 218, and others. An etch process may be performed to etch portions of the device layer 202, such as the exposed portions of the parallel lines 202A-D, through the openings 212 and 218 and the other illustrated openings in the hard mask layer 204, as described in operation 112 of FIG. 1. This etch process may "cut" the parallel lines 202A-D and other parallel lines of the device layer 202 as shown in FIG. 2H. Afterwards, the hard mask layer 204 may be removed by a different etch process, also as shown in FIG. 2H. FIG. 2H further includes dashed line representations of the openings 212, 218, and others used to cut the parallel lines 202A-D of the device layer 202.

Figure 3:
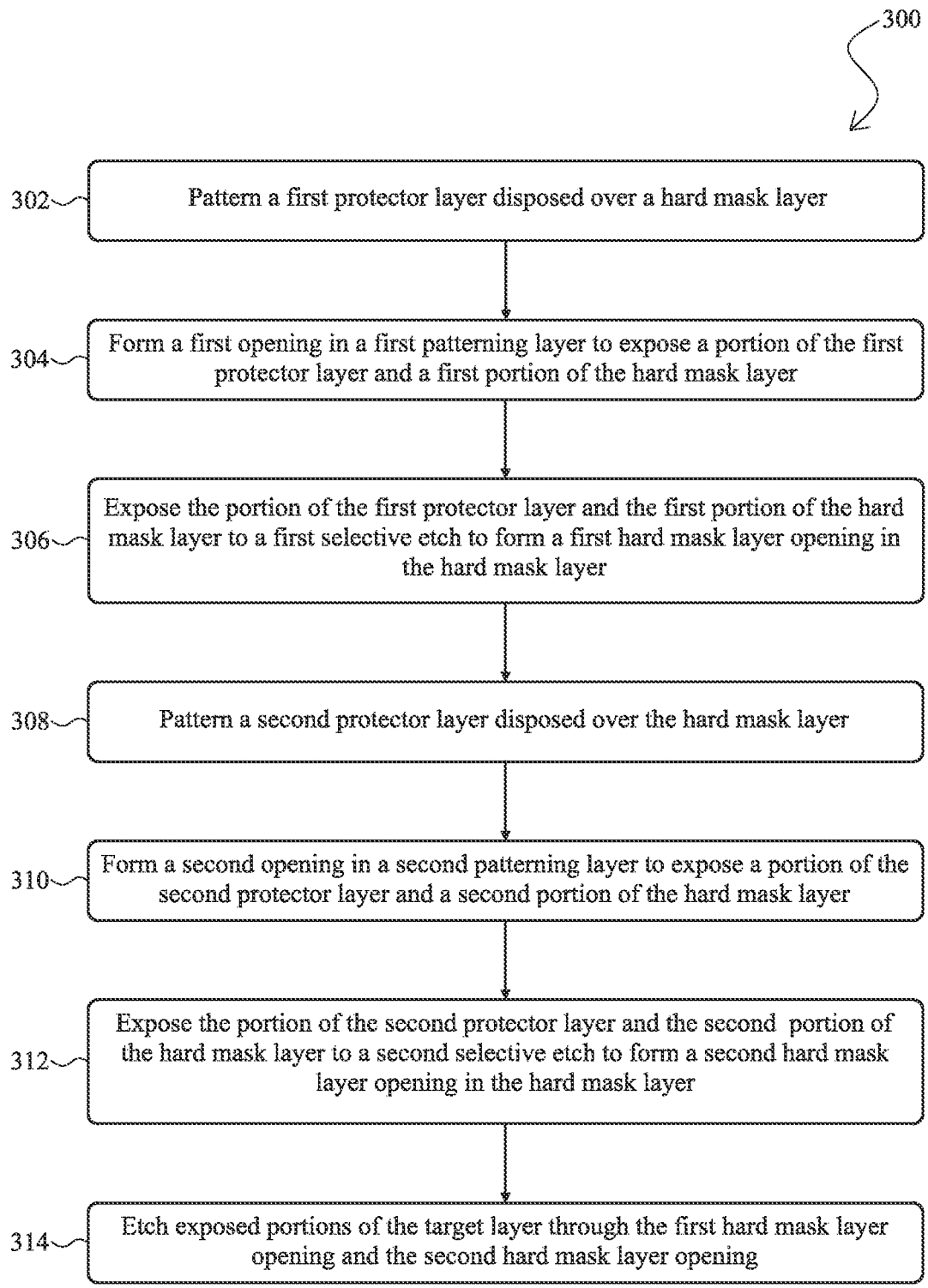
FIG. 3 is a flowchart of another method of patterning a device layer, according to aspects of the present disclosure.

Referring now to FIG. 3, shown therein is a flowchart of a method 300 of patterning a device layer in a semiconductor device fabrication process that provides improved critical dimension uniformity. Like method 100 of FIG. 1, the illustrated embodiment of method 300 includes several enumerated steps or operations. Embodiments of the method 300 may include other operations before, after, in between, or as part of the enumerated operations. Additionally, some embodiments of the method 300 may omit one or more of the enumerated operations.

Accordingly, an embodiment of the method 300 may begin at operation 302 when a first protector layer disposed over a hard mask layer is patterned, such as by a photolithography process and a subsequent etch process. At operation 304, a first opening in a first patterning layer may be formed in order to expose a portion of the first protector layer and a first portion of the hard mask layer. At operation 306, a selective etch process may be performed to etch the portion of the first protector layer and the first portion of the hard mask layer etch to form a first hard mask layer opening in the hard mask layer. Because the etch process of operation 306 is a selective etch process, the exposure to the etch process may have a greater effect on the first portion of the hard mask layer then on the first protector layer, such that relatively little thickness of the first protector layer is removed by the etch process, while the entire thickness of the first portion of the hard mask layer is removed.

At operation 308, a second protector layer disposed over the hard mask layer may be patterned by photolithography and etching or by another suitable process. In some embodiments, the second protector layer is formed from the same material from which the first protector layer is formed. A second opening and a second patterning layer may be formed to expose a portion of the second protector layer and a second portion of the hard mask layer, at operation 310. At operation 312, the portion of the second protector layer and the second portion of the hard mask layer may be exposed to a second selective etch in order to form a second hard mask layer opening in the hard mask layer. At operation 314, an etch process may be performed to etch the exposed portions of the device layer through the first hard mask layer opening and the second hard mask layer opening.

Figure 4A:
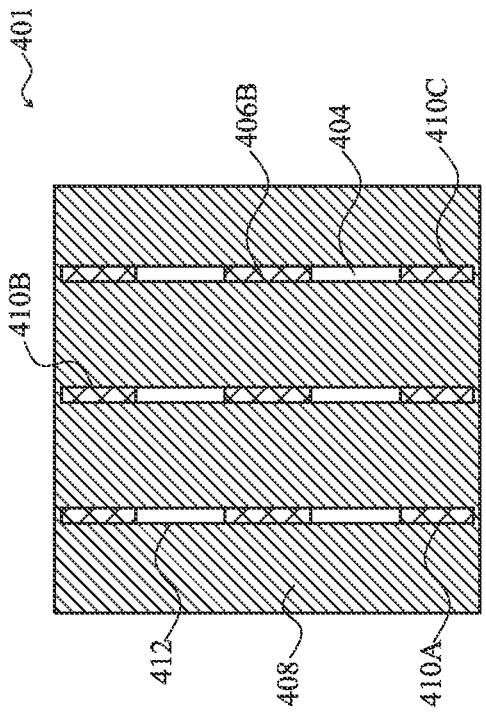

To more clearly describe some embodiments of the method 300, reference is made herein to FIGS. 4A-H, which are top view illustrations of a portion of a wafer 401 during a fabrication process like that of the method 300. As shown in FIG. 4A, the illustrated portion of the wafer 401 is similar in some respects to the wafer 201 as shown in FIG. 2C. Accordingly, the wafer 401 has a substrate 400 (or another top surface of the material layer formed over the substrate) with a device layer 402 there on may be a patterned material layer. The device layer 402 may be a masking layer to be used to pattern a layer between the device layer 402 and the substrate 400 in some embodiments. As shown in FIG. 4A, the patterned device layer 402 is represented by a plurality of dashed-line features, which are positioned beneath the device layer 402. A patterned protector layer 406 is shown as including protector layer features 406A, 406B, and 406C. As illustrated, the patterned protector layer 406 includes generally rectangular, elongate features that extend parallel to the parallel lines of the device layer 402. Other embodiments may include protector layer features of different shapes, which may be not be oriented parallel to the parallel lines of the device layer 402. Similarly, the device layer 402 may be patterned with other patterns, instead of the pattern of parallel lines depicted in FIG. 4A (and in FIG. 2C). The protector layer 406 may be formed from silicon oxide, silicon nitride, or another material that may serve as an etch stop or etch mask during semiconductor fabrication. In the illustrated embodiment, the protector layer 406 and the hard mask layer 404 are formed from different materials. In some embodiments, the protector layer 406 and the hard mask layer 404 may be formed from the same material, and the additional thickness of the added protector layer 406 may be utilized to prevent etching beneath the area defined by the protector layer 406 when the hard mask layer 404 is attached.

Figure 4B:
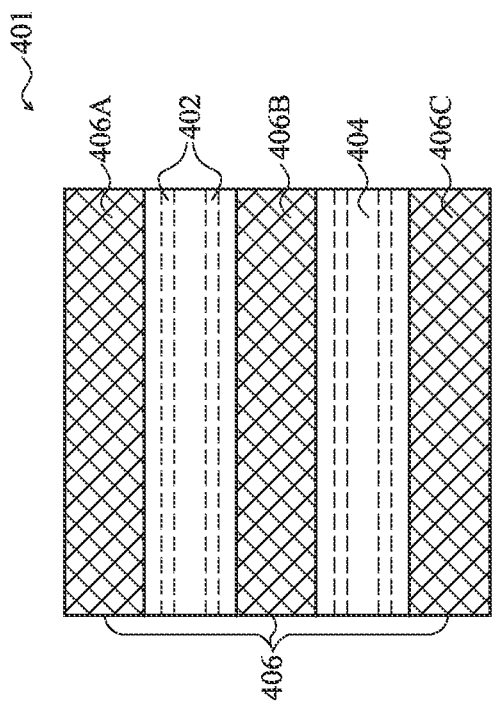

Referring now to FIG. 4B, shown therein is the wafer 401 as illustrated in FIG. 4A and further including a first patterning layer 408. The first patterning layer 408 may be a photoresist layer or other photoreactive layer that can be patterned by photolithographic processes. As illustrated in FIG. 4B, the patterning layer 408 may be patterned, at operation 304, to form openings 410A, 410B, and 410C, collectively referred to as openings 410. As shown in FIG. 4B, the openings 410 expose portions of protector layer features 406A, 406B, and 406C, as well as portions of the underlying hard mask layer 404. The geometries of the openings 410 combine with the geometries of the protector layer 406 to produce openings like the exemplary opening 412 that expose the hard mask layer 404. A total of six openings like the exemplary opening 412 are shown in FIG. 4B. Other embodiments may include more or fewer openings. Additionally, while the shape of the opening 412 is rectangular, other shapes and other patterns of shapes may be present in other embodiments.

Figure 4C:
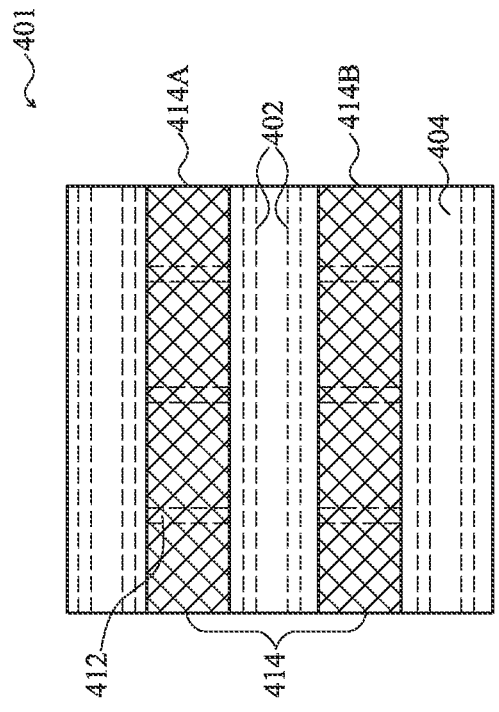
Figure 4D:
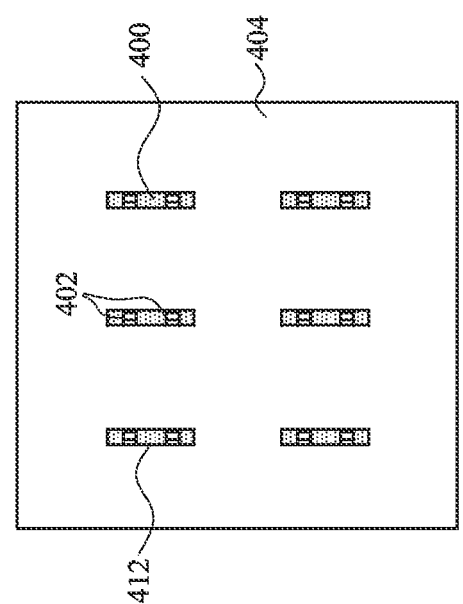

Referring now to FIG. 4C, shown therein is a result of an etch process like that of operation 306 of method 300, which forms the opening 412 through the hard mask layer 404. Six total openings, like the opening 412, are shown as being formed through the hard mask layer 404, thereby exposing the underlying substrate 400 and some of the parallel lines of device layer 402. The etch process that forms the opening 412 shown in FIG. 4C, may be a first selective etch process that uses both the first patterning layer 408 and the first protector layer 406 to provide an etch mask. While the etchant more rapidly etches through the hard mask layer 404, the etchant etches comparatively slowly through the first patterning layer 408 and the first protector layer 406, if it etches the first patterning layer 408 and the first protector layer 406 at all.

After the formation of the opening 412 and other openings corresponding to the first patterning layer 408 and the first protector layer 406, a second protector layer 414 may be formed over the surface of the wafer 401, as part of operation 308. The protector layer 414 may cover the openings formed in the hard mask layer 404 during operation 306. The protector layer 414 may include protector layer features 414A and 414B that correspond in geometry to the protector layer features 406A-C, such that the protector layers 406 and 414 are complementary to each other, forming a complementary pattern. For example, the distance between the protector layer features 406A and 406C may be approximately the same as the short dimension of protector layer feature 414B. In some embodiments, the short dimension of the protector layer feature 414B may be greater than the distance between the protector layer features 406A and 406C by less than 100 nm, less than 50 nm, less than 20 nm, etc.

Referring now to FIG. 4E, shown therein is a result of operation 310 of method 300. A second patterning layer 416 is formed over the wafer 401. For example, the second patterning layer 416 may be a photoresist layer or other sacrificial layer that is formed over the exposed portions of the hard mask layer 404 and the second protector layer 414. As illustrated, the second patterning layer 416 includes openings 418A, 418B, 418C, and 418D, collectively referred to as openings 418. The openings 418 are elongate features in the depicted embodiment. Other embodiments may include other geometries for the openings 418. The overlapping geometries of the openings 418 and the underlying second protector layer 414 forms a plurality of openings, including the exemplary opening 420. The hard mask layer 404 may be seen through the plurality of openings defined by the combination of the patterned second patterning layer 416 and the second protector layer 414.

At operation 312, the wafer 401 as shown in FIG. 4E may be subjected to an etch process. The etch process may be a second selective etch to which the portion of the second protector layer and the second portion of the hard mask layer are exposed. The etch process may etch away exposed portions of the hard mask layer 404 shown in the exemplary opening 420 and other similar windows formed in the hard mask layer 404. The opening 420 may be the second hard mask layer opening described above in connection with operation 312 of method 300. As can be seen illustrated in FIG. 4F, a total 18 openings, like the opening 420 may be formed in the hard mask layer 404 such that portions of the substrate 400 and the device layer 402 are exposed.

The hard mask layer 404 may act as an etch mask during a subsequent etch process to cut the parallel lines (or other features in other embodiments) of the device layer 402, at operation 314. A result of this cutting of the device layer 202 may be seen in FIG. 4G, which shows a portion of the wafer 401. As can be seen from FIGS. 4F and 4G, the openings in the hard mask layer 404 may be used to cut pairs of parallel lines of the device layer 402. In some embodiments, the openings in the hard mask layer 404 may be differently sized, such that some openings cause only a single parallel line or feature of the device layer 402 to be cut or three or more features of the device layer 402 may be cut. The critical dimension uniformity may be improved over known methods by implementing embodiments of the method 300.

Figure 5F:
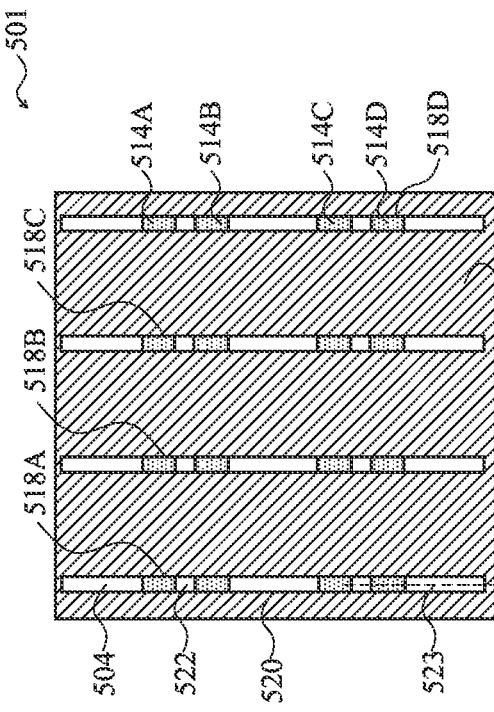

Referring now to FIGS. 5A-I, shown therein are a plurality of top view illustrations of a portion of a wafer 501 during a patterning process of a device layer, like the method 300 of FIG. 3. FIGS. 5A-H provide another embodiment that further describes the method 300 of FIG. 3. As shown in FIG. 5A, the wafer 501 may include a hard mask layer 504 disposed over a patterned device layer 502, represented by the dashed lines, with a substrate 500 or other material layer underlying the device layer 502, including a material layer to be patterned using the device layer 502 as a masking layer. The wafer 501 may be similar in many respects to the wafer 201 as illustrated in FIG. 2C.

At operation 302, a first protector layer 506 may be formed over the hard mask layer 504 and patterned using photolithographic techniques, as shown in FIG. 5B. The pattern of the first protector layer 506 may include protector layer features 506A, 506B, 506C, and others. As illustrated, the protector layer features 506A-C may be elongate in shape and may be oriented in parallel with the parallel lines of the device layer 502. The protector layer 506 may be formed of a different material than the hard mask layer 504, such that the protector layer 506 and the hard mask layer 504 have different etch rates for some etchants and/or etch processes.

Referring now to FIG. 5C, shown therein is a first patterning layer 508 formed over the protector layer 506 and the hard mask layer 504. The first patterning layer 508 may be a photoreactive layer that has undergone a photolithographic process to generate openings 510A, 510B, and 510C, collectively referred to as openings 510. The openings 510 of FIG. 5C are elongate features that extend orthogonally to the parallel lines of the device layer 502, and may be formed at operation 304 in an embodiment of method 300. The openings 510 exposed portions of the hard mask layer 504 and the protector layer 506. The overlapping geometries of the protector layer 506 and the first patterning layer 508 form a plurality of windows or openings, like the exemplary opening 512. As illustrated in FIG. 5C, the protector layer 506 and the first patterning layer 508 combined to form six openings that leave portions of the hard mask layer 504 exposed. At operation 306, the wafer 501 may be exposed to an etch process. While portions of the hard mask layer 504 (defined by the opening 512 and other such openings) and the protector layer 506 may be exposed to the etch process, the selectivity of the etch process may result in substantially more etching of the hard mask layer 504 than of the protector layer 506.

A result of the operation 306 may be shown in FIG. 5D, which shows the substrate 500 and portions of the device layer 502 in the opening 512 and other comparable openings. The first patterning layer 508 may be removed from the wafer 501 in preparation for further processing. As shown in FIG. 5E a spacer material may be deposited over the surface of the wafer 501, to form spacer features 514A, 514B, 514C, and 514D, collectively spacer features 514. One spacer may be formed on each side of the protector layer features 506A-C, such that the spacer features 514 are partially defined by the protector layer 506. The spacer features 514 cover portions of the exposed hard mask layer 504 as well as portions of the device layer 502 and the substrate 500. As can be seen in FIG. 5E, a portion of the substrate 500 may remain uncovered by the spacer features 514. The formation of the spacer features 514 shown in FIG. 5E, may occur during operation 308, when a second protector layer disposed over the hard mask layer 504 is patterned. The spacer features 514 may be an embodiment of the second protector layer of method 300.

Figure 5G:
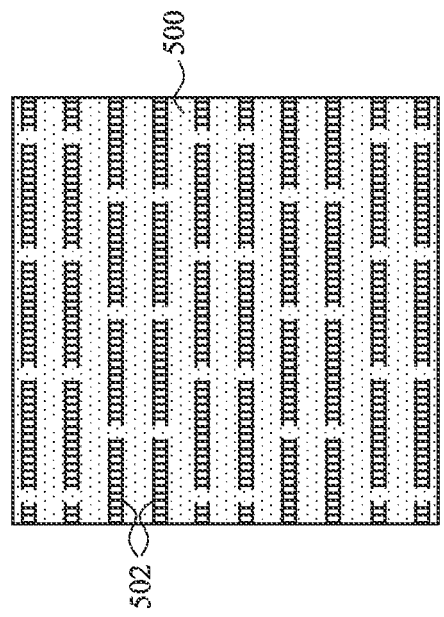

Referring now to FIG. 5F, shown therein is the wafer 501 after the first protector layer 506 is removed, leaving spacer features 514A, 514B, 514C, and 514D disposed above the hard mask layer 504. A portion of the substrate 500 may be exposed through an exposed portion of the opening 512 and other comparable openings previously formed in the hard mask layer 504. As shown in FIG. 5G, a second patterning layer 516 is formed over the wafer 501 such that it covers the hard mask layer 504 as well as the spacer features 514. During operation 310 of method 300, a plurality of openings may be formed in the second patterning layer 516. As illustrated in FIG. 5G, elongate openings 518A, 518B, 518C, and 518D may be formed into the patterning layer 516 by a photolithographic process. Each of the openings 518 may expose at least a portion of the hard mask layer 504 and a portion of one of the spacer features 514. The overlapping geometries of the opening 518A formed in the second patterning layer 516 and the spacer features 514 forms a plurality of openings, including an opening 520 and an opening 522. The openings 520 and 522 may be aligned along a common axis 523. The opening 522 may be an assist feature defined by the geometries of the opening 518A and the spacer features 514A and 514B. The dimensions of the assist feature opening 522 may be such that the opening 522 is not intended to be patterned into the hard mask layer 504. In other embodiments, the opening 522 may be patterned into the hard mask layer 504 during subsequent processing.

Figure 5H:
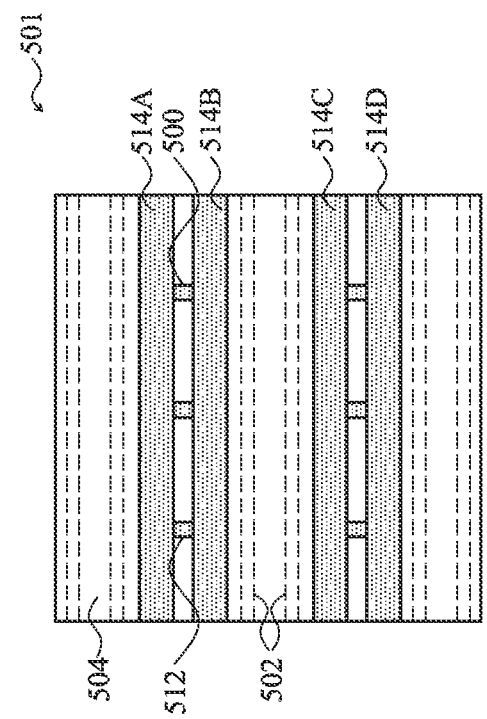
Figure 5I:
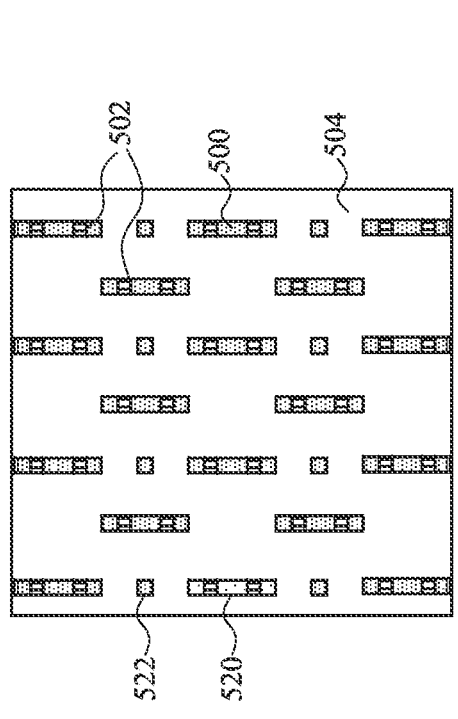

At operation 312, the pattern formed by the openings 518 and the spacer features 514 may be etched into the hard mask layer 504 when the wafer 501 is exposed to a second selective etch process that etches the exposed portions of the hard mask layer 504 at a significantly faster rate than the exposed portions of the spacer features 514. After the selective etch process is performed and the second patterning layer 516 and the spacer features 514 are removed, the wafer 501 may appear as illustrated in FIG. 5H. FIG. 5H shows intact portions of the hard mask layer 504 and exposed portions of the underlying substrate 500 and the device layer 502. The exposed portions may be defined by the openings 512, 520, and 522 along the other openings depicted in FIG. 5H. At operation 314, and etch process may be performed to remove exposed portions of the device layer 502. In the depicted embodiment, the opening 522 does not expose the device layer 502 and so does not cause the device layer 502 to be etched. In such an embodiment, the opening 522 may be an assist feature included to increase the fidelity of pattern transfer. A result of the patterning process of the method 300 may be seen in FIG. 5 by which depicts the substrate 500 and a plurality of cut features, such as transistor gates, formed in the device layer 502.

Figure 6:
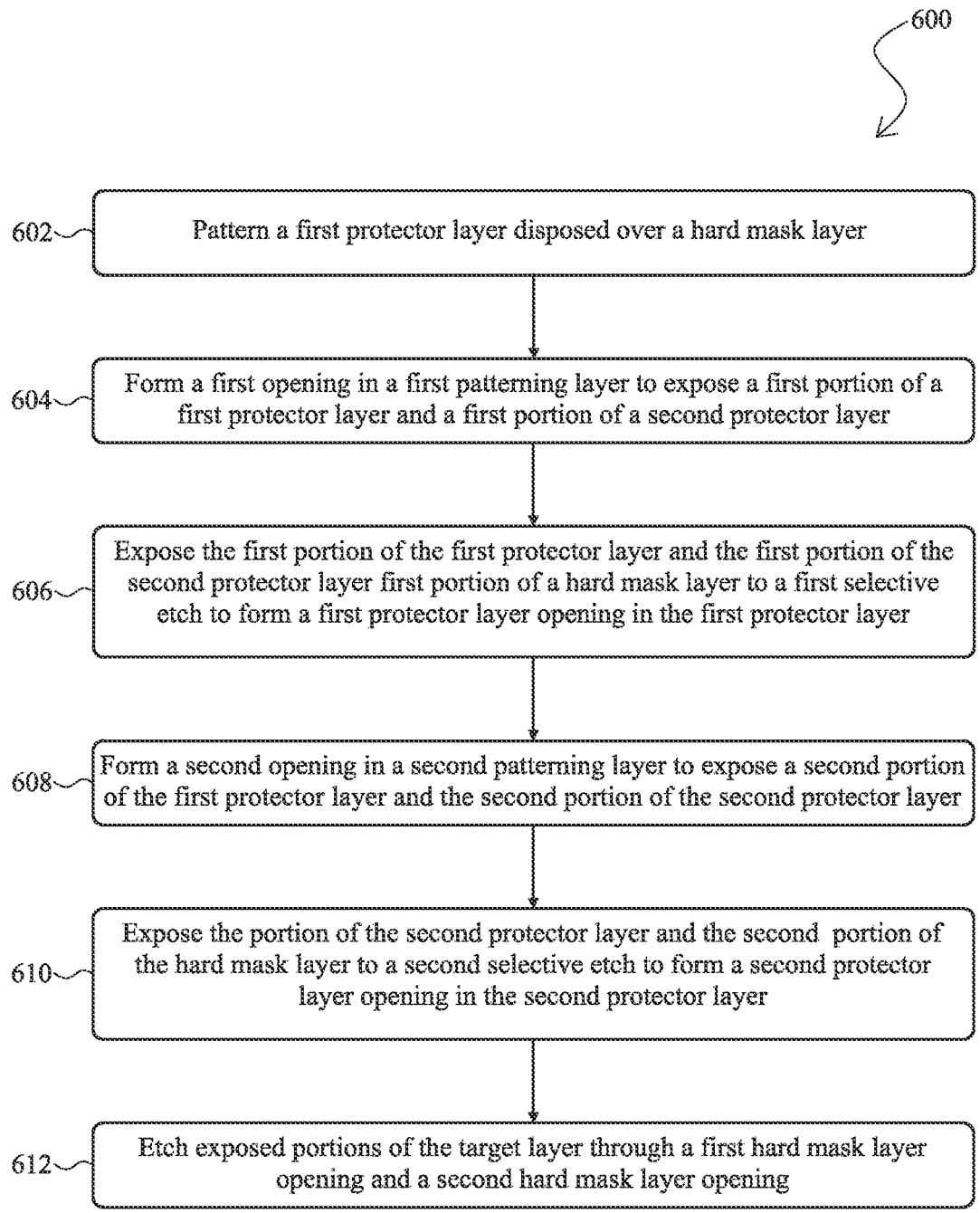
FIG. 6 is a flowchart of another method of patterning a device layer, according to aspects of the present disclosure.

Referring now to FIG. 6, shown therein is a flowchart of a method 600, according to some aspects of the present disclosure. Like the methods 100 and 300 of FIGS. 1 and 6, respectively, the method 600 is illustrated as a plurality of steps or operations. Embodiments of the method 600 may include additional or alternative operations before, after, in between, or as part of the enumerated operations. Some embodiments of the methods described herein may omit one or more of the enumerated operations.

Accordingly, an embodiment of the method 600 may begin at operation 602 when a first protector layer disposed over a hard mask layer is patterned. In some embodiments, a second protector layer may be formed after the patterning of the first protector layer and before any additional patterning layers are disposed over the first protector layer. At operation 604, a first opening in a first patterning layer may be formed to expose a first portion of a first protector layer and a first portion of a second protector layer. Method 600 may continue when the first portion of the first protector layer and the first portion of the second protector layer are exposed to a first selective etch to form a first protector layer opening in the first protector layer, at operation 606. In some embodiments, an additional etch process is performed to etch the portion of the hard mask layer exposed by the first protector layer opening.

At operation 608, a second opening in a second patterning layer may be formed over the wafer to expose a second portion of the first protector layer and a second portion of the second protector layer. The second portion of the second protector layer and the second portion of the first protector layer to may be subjected to a second selective etch to form a second protector layer opening in the second protector layer, at operation 610. The second protector layer opening may expose a portion of the device layer. And at operation 612, the exposed portions of the hard mask layer may be etched to form a first hard mask layer opening and a second hard mask layer opening. Another etch process may be performed to remove exposed portions of the device layer through the first and second hard mask layer openings.

Figure 7F:
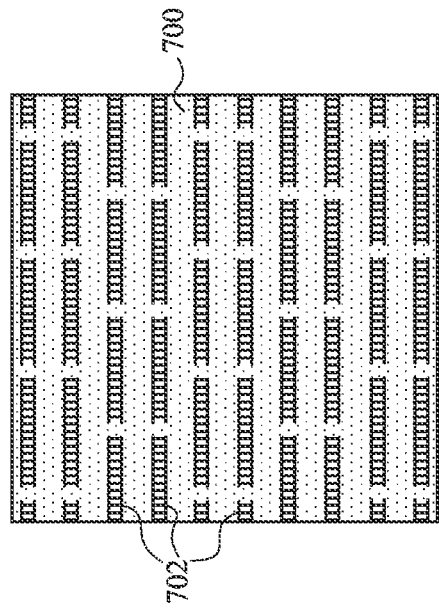

To more clearly describe the method 600, reference will now be made to FIGS. 7A-G, which depict a series of top view illustrations of a wafer 701 during a fabrication process such as an embodiment of the method 600. As shown in FIG. 7A, the wafer 701 may include a first protector layer 710 (including protector layer features 710A, 710B, and 710C. A second protector layer 712 is formed on the wafer 701, and may include multiple exposed portions including protector layer portions 712A and 712B. As is shown in subsequent figures, beneath the protector layers 710 and 712, the wafer 701 may include a substrate 700 and a device layer 702. The substrate 700 may have one or more material layers disposed thereon that are interposed between the top surface of the substrate 700 and a bottom surface of the device layer 702. The device layer 702 may be patterned into a plurality of lines similar to the device layer 202 shown in FIG. 2B.

As shown in FIG. 7B, a first patterning layer 714 may be formed over the wafer 701, such that the patterning layer 714 at least partially covers the protector layers 710 and 712. The patterning layer 714 may be a photoreactive material layer. Openings may be formed in the first patterning layer 714, including elongate openings 716A, 716B, and 716C, by a photolithographic process including operations of exposure and development, which may be part of operation 604. The opening 716A, 716B, and 716C, collectively referred to as openings 716, may be elongate openings as depicted, while having other shapes in other embodiments. The openings 716 may be substantially identical to each other or include a plurality of different shapes. As illustrated in FIG. 7B, the opening 716A exposes multiple portions of the underlying protector layers 712 and 710. The overlapping geometries of the opening 716A and the protector layer features 710A, 712A, and 710B forms an area 718. When the wafer 701 is exposed to a selective etch that selectively etches the material of protector layer 712, at operation 606, the area 718 may be etched to produce a window or opening 720 formed in the protector layer 712 such that a portion of the hard mask layer 704 is exposed, as shown in FIG. 7C. As shown in FIG. 7C, a plurality of openings like the opening 720 may be formed in the protector layer 712 to expose the underlying hard mask layer 704. In some embodiments of the method 600, and etch process may be performed to remove the exposed portions of the hard mask layer 704, before additional processing is performed, such as the formation and patterning of a second patterning layer over the protector layers 710 and 712, at operation 608. In the depicted embodiment, the pattern defined by the opening 720 (and the other illustrated openings of FIG. 7C) is not etched into the hard mask layer 704 at this time in the method 600.

Referring now to FIG. 7D, a second patterning layer 722 may be formed over the wafer 701 such that it covers the protector layers 710 and 712 and the openings formed in the protector layer 712. At operation 608, openings 724A, 724B, 724C, and 724D may be formed in the patterning layer 722. The patterning layer 722 may be a photoresist layer or other photoreactive layer. The openings 724 may expose portions of the protector layers 710 and 712. As illustrated in FIG. 7, the openings 724 expose portions of the protector layer features 710A, 710B, and 710C as well as protector layer features 712A and 712B.

Figure 7H:
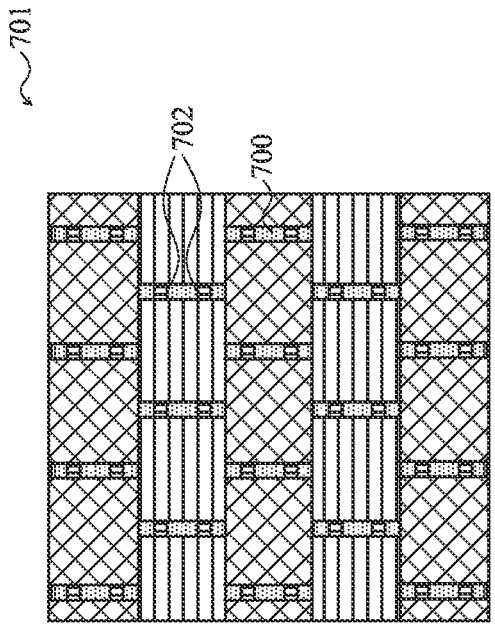
Figure 7E:
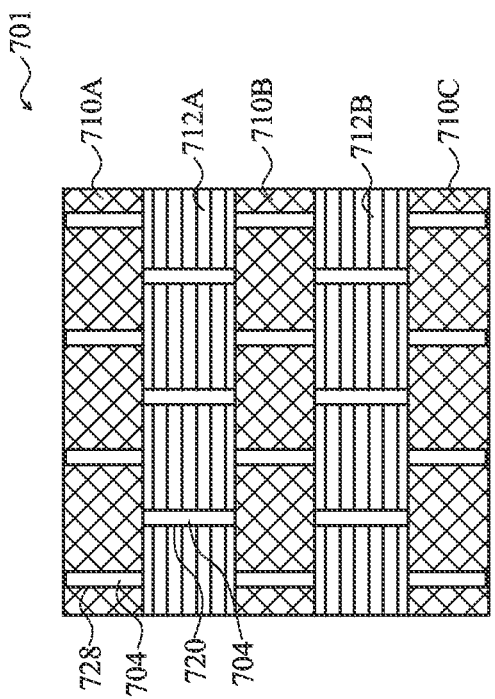

As shown in FIG. 7D, the opening 724 and the protector feature 712A define an area 726 and a plurality of similar areas. By using a selective etch process at operation 610, the exposed portions of the protector layer 710 may be etched without significantly etching the exposed portions of the protector layer 712. The selective etch process may form openings in the protector layer 710 like the exemplary opening 728, as shown in FIG. 7E, which further illustrates a plurality of such openings formed in the protector layer 710 in addition to openings formed in the protector layer 712, like the opening 720. FIG. 7E illustrates the wafer 701 after the selective etching to remove exposed portions of the protector layer 710 and after removal of the second patterning layer 722. As shown in FIG. 7E, the wafer 701 includes a plurality of openings like the opening 720 and 728 and other openings in the protector layers 710 and 712 that expose portions of the hard mask layer 704.

As shown in FIG. 7F, the wafer 701 is exposed to an etch process that removes these exposed portions of the hard mask layer 704, thereby exposing the underlying substrate 700 and the plurality of parallel features of the device layer 702. The etch process may be a selective etch process that etches the hard mask layer 704 at a significantly faster rate than the etch process etches either the protector layer 710 or the protector layer 712. In some embodiments, rather than etch the portions of the hard mask layer 704 exposed by openings in the protector layer 710 at the same time as the portions of the hard mask layer 704 exposed by openings in the protector layer 712, separate etch steps may be performed for each. For example, after the opening 720 is formed in the protector layer 712A is shown in FIG. 7C, an etch process may be used to transfer the geometry of the opening 720 into the hard mask layer 704, thereby exposing the underlying substrate 700 and the device layer 702. In such an embodiment, when the second patterning layer 722 is removed, portions of the device layer 702 may already be exposed through the protector layer 712.

Figure 7G:
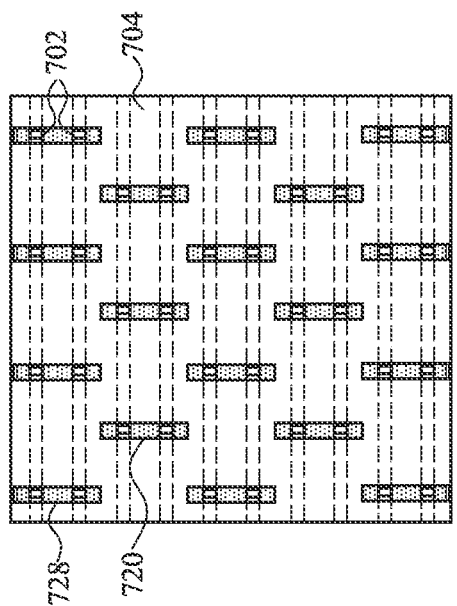

Referring now to FIG. 7G, prior to etching the exposed portions of the device layer 702, the remaining portions of the protector layers 710 and 712 may be removed in some embodiments, such that the hard mask layer 704 functions as an etch mask rather than the remaining portions of the protector layer 710 and 712. After the exposed portions of the parallel lines of the device layer 702 are removed, the remaining hard mask 704 may be removed as shown in FIG. 7H. The etched portions of the device layer 702 may cut or separate lengths of the parallel lines. While the openings 720 and 728, and the other similar openings formed in the protector layers 710 and 712, are depicted as spanning two parallel lines of the device layer 702, other embodiments may span more or fewer parallel lines or other features.

Another embodiment of the method 600 is described herein with respect to FIGS. 8A-G. Shown therein is a wafer 801 having protector layers 810 and 812 formed thereon. As illustrated in FIG. 5A, the protector layer 810 is patterned into protector layer features 810A, 810B, and 810C. The protector layer 812 is patterned into protector layer features 812A and 812B. The protector layers 812 and 810 may be non-overlapping material layers that form a continuous surface over the wafer 801. The depicted surface of the protector layers 810 and 812 may be a continuous planar surface. One or more of the protector layers 810 and 812 may be formed of operation 602 of the method 600.

Figure 8A:
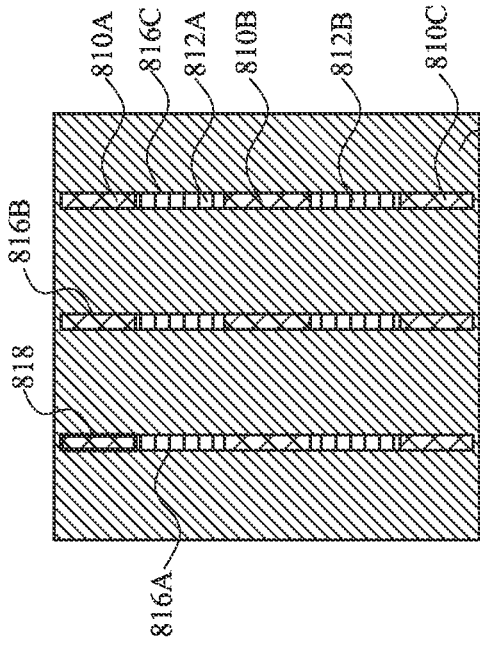
Figure 8B:
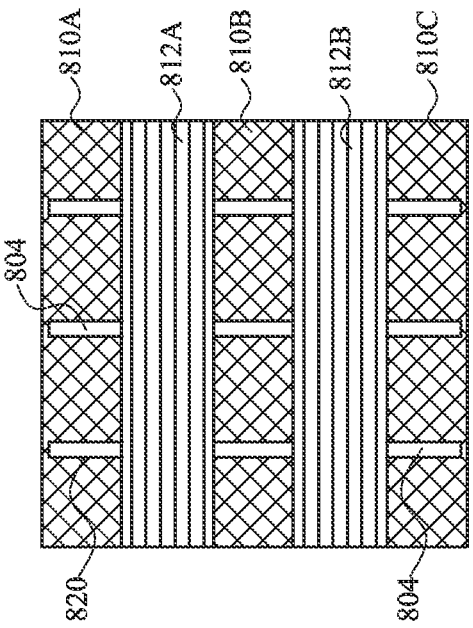

Referring now to FIG. 8B, shown therein a first patterning layer 814 may be formed over the wafer 801, such that the patterning layer 814 at least partially covers the protector layers 810 and 812. The patterning layer 814 may be a photoreactive material layer. Openings may be formed in the first patterning layer 814, including elongate openings 816A, 816B, and 816C, by a photolithographic process including operations of exposure and development, which may be part of operation 604. The openings 816A, 816B, and 816C, collectively referred to as openings 816, may be elongate openings as depicted, while having other shapes in other embodiments. The openings 816 may be substantially identical to each other or may include a plurality of different shapes. As illustrated in FIG. 8B, the opening 816A exposes multiple portions of the underlying protector layers 812 and 810. The overlapping geometries of the opening 816A and the protector layer feature 812A form and define an area 818.

Figure 8C:
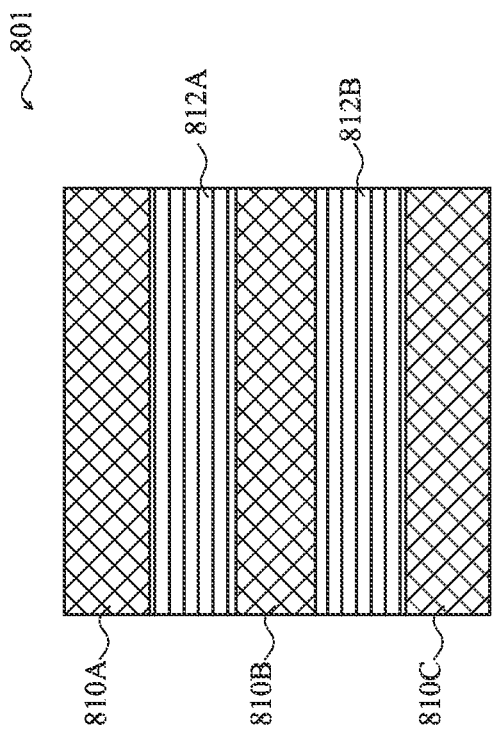
Figure 8D:
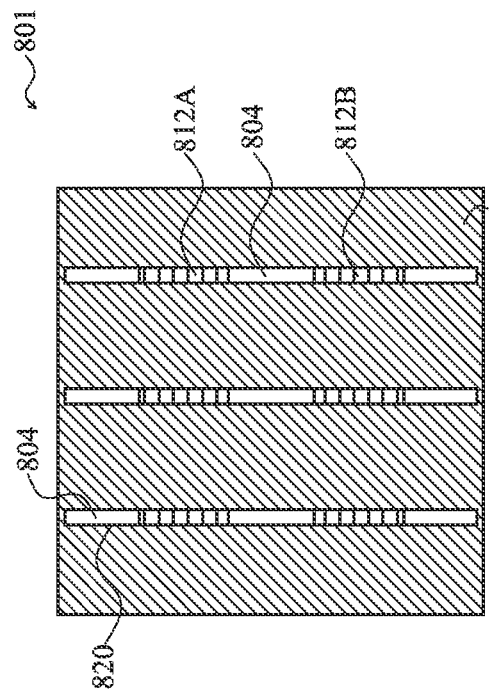

When the wafer 801 is exposed to a selective etch that selectively etches the material of protector layer 810, at operation 606, the area 818 may be etched to produce a window or opening 820 formed in the protector layer 810 such that a portion of the hard mask layer 804 is exposed, as shown in FIG. 8C. As shown in FIG. 8C, a plurality of openings like the opening 820 may be formed in the protector layer 810 to expose the underlying hard mask layer 804, as defined by the geometries of the openings 8126 in the first patterning layer 814 and the individual features of protector layer 812. In some embodiments of the method 600, an etch process may be performed to remove the exposed portions of the hard mask layer 804 before additional processing is performed, such as the formation and patterning of a second patterning layer over the protector layers 810 and 812, at operation 608. In the depicted embodiment, the pattern defined by the opening 820 (and the other illustrated openings of FIG. 8C) is not etched into the hard mask layer 804 at this time in the method 600. FIG. 8D shows the result after removal of the first patterning layer 814 from the wafer 801.

Referring now to FIG. 8E, a second patterning layer 822 may be formed over the wafer 801 such that it covers the protector layers 810 and 812 and the openings formed in the protector layer 810. At operation 608, openings 824A and 824B may be formed in the patterning layer 822. The patterning layer 822 may be a photoresist layer or other photoreactive layer, patterned by photolithography. The openings 824 may expose portions of the protector layers 810 and 812. As illustrated in FIG. 8E, the openings 824 overlap with the opening 820 and other similar openings previously formed in the protector layer 810, which exposes portions of the hard mask layer 804. The overlapping geometries of the opening 824A and the exposed portions of the hard mask layer 804 and protector pattern features 810A and 810B define an area 826 and three similar areas in the portion of the wafer 801 shown in FIG. 8E.

As shown in FIG. 8F, the selective etch process at operation 610 may remove exposed portions of the protector layer features 812A and 812B from the area 826 to produce an opening 828 that exposes the hard mask layer 804 underneath. The exposed portions of the protector layer 812 may be etched without significantly attaching the exposed portions of the protector layer 810 or the hard mask layer 404. The material layers that provide the protector layer 810, the protector layer 812, and the hard mask layer 404 may each be made of a different material having different selectivities to the etchant used in operation 610. For example, the protector layer 810 may be formed from silicon oxide, while the protector layer 812 is formed from silicon nitride and the hard mask layer 404 is formed from titanium nitride. Other combinations of materials may be used in other embodiments. The selective etch process may form openings in the protector layer 812 like the exemplary opening 828, as shown in FIG. 8F, which further illustrates a plurality of such openings formed in the protector layer 812 in addition to openings formed in the protector layer 810, like the opening 820, as the patterning layer 822 is removed from the wafer 801. Thus, FIG. 8F illustrates the wafer 801 after the selective etching to remove exposed portions of the protector layer 812 and after removal of the second patterning layer 822. As shown in FIG. 8F, the wafer 801 includes a plurality of openings like the opening 820 and 828 and other openings in the protector layers 810 and 812.

As shown in FIG. 8G, the protector layers 810 and 812 may be removed from off the hard mask layer 804. FIG. 8G shows a combined opening 830 resulting from the merging of the openings 820 and 828 as shown in FIG. 8F when the hard mask layer is exposed to an etch process. Additionally, isolated openings like the opening 832 may also be present as a result of the etching process to which the hard mask layer 804 is subjected, during operation 610 of the method 600. The wafer 801 is exposed to an etch process that removes the exposed portions of the hard mask layer 804, thereby exposing the underlying substrate 800 and the plurality of parallel features of the device layer 802. The etch process may be a selective etch process that etches the hard mask layer 804 at a significantly faster rate than the etch process etches either the protector layer 810 or the protector layer 812. The openings 830, 832, and other illustrated openings expose portions of the substrate 800 and the device layer 802. In the depicted embodiment, the device layer 802 is a patterned layer that includes a plurality of parallel line features.

Referring now to FIG. 8H, the exposed portions of the parallel lines of the device layer 802 may be removed by an etch process according to operation 612 of the method 600. The etch process may remove portions of the device layer 802 so as to cut the parallel lines of the device layer 802. The cut to the parallel lines of the device layer 802 may be less than 16 nm in some embodiments. Embodiments of the method 600, and embodiments of the other methods described herein, may be used to generate separations between the parallel lines or other features of the device layer 802 that could not be realized or would be difficult to realize by direct patterning of the device layer 802, such as that used to create the parallel lines shown in FIG. 8H Removed, the remaining hard mask 804 may be removed as shown in FIG. 8H. The etched portions of the device layer 802 may cut lengths of the parallel lines. While the openings 830 and 832, and the other similar openings formed in the hard mask 804, are depicted as spanning two parallel lines of the device layer 802, other embodiments may span more or fewer parallel lines.

The patterns formed by the openings 820 and 828, as shown in FIG. 8F, may result in the twist patterns 834A and 834B and the tight cut-to-cut pattern 836. The twist patterns 834A and 834B produce a staggered pattern in which the location of a cut can vary from parallel line to parallel line of the device layer 802. Other patterns may be produced using the methods described herein.

In some embodiments, the device layer 802 (and other device layers described herein) may serve as etch masks for subsequent processing performed to the substrate 800 or to one or more material layers disposed in between the device layer 802 and the substrate 800.

Although some embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. Additionally, combinations of features from the disclosed embodiments are within the scope of the present disclosure. In the claims, means-plus-function clauses are intended to cover the structures described herein as performing the recited function and not only structural equivalents, but also equivalent structures.

In one exemplary aspect, the present disclosure is directed to a method of patterning a device layer. The method includes patterning a protector layer disposed over a hard mask layer and forming a first opening in a first patterning layer to expose a first portion of the protector layer and a first portion of the hard mask layer. The first portion of the protector layer and the first portion of the hard mask layer are exposed to a first selective etch to form a first hard mask layer opening in the first portion of the hard mask layer. The method further includes forming a second opening in a second patterning layer to expose a second portion of the protector layer and a second portion of the hard mask layer, exposing the second portion of the protector layer and the second portion of the hard mask layer to a second selective etch to form a second hard mask layer opening in the second portion of the hard mask layer, and etching exposed portions of the device layer through the first hard mask layer opening and the second hard mask layer opening.

In another exemplary aspect, the present disclosure is directed to another method of patterning a device layer. The method includes patterning a first protector layer disposed over a hard mask layer and forming a first opening in a first patterning layer to expose a portion of the first protector layer and a first portion of the hard mask layer. The portion of the first protector layer and the first portion of the hard mask layer are exposed to a first selective etch to form a first hard mask layer opening in the hard mask layer. A second protector layer disposed over the hard mask layer is patterned. The method further includes forming a second opening in a second patterning layer to expose a portion of the second protector layer and a second portion of the hard mask layer and exposing the portion of the second protector layer and the second portion of the hard mask layer to a second selective etch to form a second hard mask layer opening in the hard mask layer. Exposed portions of the device layer are exposed through the first hard mask layer opening and the second hard mask layer opening.

In another exemplary aspect, the present disclosure is directed to another method of patterning a device layer. The method includes forming a first opening in a first patterning layer to expose a first portion of a first protector layer and a first portion of a second protector layer and exposing the first portion of the first protector layer and the first portion of the second protector layer to a first selective etch to form a first protector layer opening in the first protector layer. A second opening in a second patterning layer is formed to expose a second portion of the first protector layer and the second portion of the second protector layer. The method further includes exposing the second portion of the second protector layer and the second portion of the first protector layer to a second selective etch to form a second protector layer opening in the second protector layer and etching exposed portions of the device layer through a first hard mask layer opening and a second hard mask layer opening.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a device layer on a substrate;
   forming a material layer over the device layer;
   forming a protector layer over the material layer;
   forming a first patterning layer over the protector layer, wherein a first portion of the protector layer is exposed by the first patterning layer;
   removing the first portion of the protector layer;
   removing the first patterning layer to expose a second portion of the protector layer;
   forming a second patterning layer over the protector layer, wherein the second portion of the protector layer is exposed by the second patterning layer;
   removing the second portion of the protector layer; and
   patterning the material layer by using the protector layer as a mask, wherein a portion of the device layer is exposed after patterning the material layer.

2. The method of claim 1, further comprising patterning the exposed portion of the device layer by using the material layer as a mask.

3. The method of claim 1, wherein the forming of the protector layer over the material layer includes forming a first protector layer formed of a first material and a second protector layer formed of a second material that is different than the first material.

4. The method of claim 1, wherein the second portion of the protector layer is exposed by the first patterning layer after the forming of the first patterning layer over the protector layer.

5. The method of claim 1, wherein the forming the first patterning layer over the protector layer includes forming the first patterning layer directly on the second portion of the protector layer.

6. The method of claim 1, wherein the protector layer includes a silicon containing material, and
   wherein at least one of the first and second patterning layers includes a photosensitive material.

7. The method of claim 1, wherein the material layer includes a material selected from the group consisting of a metal layer, an oxide layer and a nitride layer.

8. A method comprising:
   forming a device layer over a substrate;
   forming a material layer over the device layer;
   forming a protector layer over the material layer, wherein a first portion of the material layer is exposed by the protector layer after the forming of the protector layer over the material layer;
   forming a first patterned material layer over the protector layer, wherein the first portion of the material layer is exposed by the first patterned material layer;
   removing the first portion of the material layer;
   removing the first patterned material layer;
   forming a second patterned material layer over the protector layer, wherein a second portion of the material layer is exposed by the second patterned material layer after the forming of the second patterned material layer over the protector layer;
   removing the second portion of the material layer;
   removing the second patterned material layer; and
   patterning the device layer while using the material layer as a mask.

9. The method of claim 8, wherein a first portion of the device layer is exposed after the removing of the first portion of the material layer and a second portion of the device layer is exposed after the removing of the second portion of the material layer.

10. The method of claim 9, wherein the patterning of the device layer includes removing the first and second portions of the device layer.

11. The method of claim 9, wherein first portion of the device layer is covered by the second patterned material layer after the forming of the second patterned material layer over the protector layer.

12. The method of claim 8, wherein the removing of the first patterned material layer includes completely removing the first patterned material layer from over the substrate, and
   wherein the removing of the second patterned material layer includes completely removing the second patterned material layer from over the substrate.

13. The method of claim 8, wherein the protector layer has a checkboard pattern after the forming of protector layer over the material layer.

14. The method of claim 8, wherein the forming of the second patterned material layer over the protector layer includes forming the second patterned material layer directly on the protector layer.

15. The method of claim 8, wherein the removing of the first portion of the material layer exposes a portion of the substrate.

16. A method comprising:
   forming a device layer over a substrate;
   forming a material layer over the device layer;
   forming a protector layer over the material layer;
   forming a spacer layer on the protector layer;
   removing the protector layer to expose a first portion of the material layer;
   forming a first patterning layer over the spacer layer, the first patterning layer defining an opening that exposes a first portion of the spacer layer and the first portion of the material layer; and removing the first portion of the material layer to expose a first portion of the device layer.

17. The method of claim 16, wherein the removing of the first portion of the material layer to expose the first portion of the device layer includes using the first portion of the spacer layer and the first patterning layer as a mask.

18. The method of claim 16, further comprising:
removing the first patterning layer and the spacer layer; and
removing the first portion of the device layer while using the material layer as a mask.

19. The method of claim 16, further comprising:
forming a second patterning layer on the protector layer prior to forming the spacer layer on the protector layer; and
removing a second portion of the material layer while using the second patterning layer and the protector layer as a mask, wherein a second portion of the device layer is exposed by the removing of the second portion of the material layer.

20. The method of claim 19, further comprising removing the second patterning layer prior to forming the spacer layer on the protector layer.

* * * * *